US006829562B2

(12) United States Patent
Sarfert

(10) Patent No.: US 6,829,562 B2
(45) Date of Patent: Dec. 7, 2004

(54) METHOD AND DEVICE FOR STATE SENSING OF TECHNICAL SYSTEMS SUCH AS ENERGY STORES

(75) Inventor: Christel Sarfert, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/075,834

(22) Filed: Feb. 13, 2002

(65) Prior Publication Data

US 2002/0169581 A1 Nov. 14, 2002

(30) Foreign Application Priority Data

Feb. 13, 2001 (DE) .......................................... 101 06 505

(51) Int. Cl.$^7$ ............................ G21C 17/00; H02J 7/00
(52) U.S. Cl. ...................................... 702/182; 320/132
(58) Field of Search ........................ 702/182; 320/132; 324/426, 307; 340/636.1, 636.19

(56) References Cited

U.S. PATENT DOCUMENTS

| | | | | |
|---|---|---|---|---|
| 5,349,540 | A | * | 9/1994 | Birkle et al. .................. 703/13 |
| 6,011,379 | A | * | 1/2000 | Singh et al. ................. 320/132 |
| 6,208,949 | B1 | * | 3/2001 | Eatwell ....................... 702/189 |
| 6,300,763 | B1 | * | 10/2001 | Kwok .......................... 324/427 |
| 6,307,351 | B1 | * | 10/2001 | Yokoyama .................. 320/132 |
| 6,359,419 | B1 | * | 3/2002 | Verbrugge et al. .......... 320/132 |
| 6,362,598 | B2 | * | 3/2002 | Laig-Horstebrock et al. .... 320/132 |
| 6,441,585 | B1 | * | 8/2002 | Bertness ...................... 320/132 |
| 6,441,586 | B1 | * | 8/2002 | Tate et al. ................... 320/132 |
| 6,453,249 | B1 | * | 9/2002 | Shibutani et al. ............. 702/63 |
| 6,515,454 | B2 | * | 2/2003 | Schoch ........................ 320/132 |
| 6,534,954 | B1 | * | 3/2003 | Plett ............................ 320/132 |

FOREIGN PATENT DOCUMENTS

| | | |
|---|---|---|
| DE | 199 59 019 | 6/2001 |
| EP | 0 505 333 | 12/1998 |
| WO | WO 00/41042 | 7/2000 |

OTHER PUBLICATIONS

Wei–Yong Yan et al., "Convergent Algorithms for Frequency Weighted L$_2$ Model Reduction," Systems & Control Letters, vol. 31 (1997) pp. 11–20.

Takayuki Torikai et al., "Research and Development of the Model–Based Battery State of Charge Indicator," Signal Proceeding and Systems Control, Intelligent Sensors and Instrumentation, San Diego, Nov. 9–13, 1992, Proceedings of the International Conference on Industrial Electronics, Control; Instrumentation and Automation (IECON), New York; IEEE, US, vol. 3, Conf. 18, Nov. 9, 1992 (Nov. 9, 1992), pp. 996–1001.

Stefano Soatto et al., "Dynamic Data Factorization,"Technical Report UCLA CSD 010001, Mar. 6, 2000, pp. 1–8.

* cited by examiner

*Primary Examiner*—John Barlow
*Assistant Examiner*—Toan M. Le
(74) *Attorney, Agent, or Firm*—Kenyon & Kenyon

(57) ABSTRACT

A method and a device for state sensing of a technical system, such as an energy store, in which performance quantities are measured and supplied to a state estimation routine, which determines the state variables characterizing the current system state using a model based on system-dependent model parameters and the measured performance quantities. To improve state estimation, the measured performance quantities may be supplied to a parameter estimation routine, which performs a use-dependent determination of the model parameters. To increase the quality of the estimation and reduce the calculating time and the memory requirements, a selection of state variables and/or parameters determined by estimation are performed depending on the dynamic response of the measured performance quantities.

12 Claims, 5 Drawing Sheets

METHOD AND DEVICE FOR STATE SENSING OF TECHNICAL SYSTEMS SUCH AS ENERGY STORES

FIELD OF THE INVENTION

The present invention relates to a method for state sensing of a technical system, for example, an energy store, in which performance quantities are measured and supplied to a state estimation routine, which determines state variables characterizing the current system state using a model based on system-dependent model parameters and the measured performance quantities, the measured performance quantities and possibly the determined state variables additionally being supplied to a parameter estimation routine, which in turn, determines the model parameters depending on a use by estimation, to improve the state estimation. The present invention further relates to a corresponding device and a computer program for performing the method and a computer program.

BACKGROUND INFORMATION

A method for battery state identification is referred to in German Published Patent Application No. 199 59 019. Proceeding from measurable performance quantities, such as current, voltage, and temperature, state variables are determined by estimation using a model, which is implemented as a (Kalman) filter. Since the parameters of the model may change due to aging of the battery and by suddenly occurring defects, a parameter estimation routine tracks the parameter changes online and adjusts the parameters appropriately. The current parameters are then supplied to the state estimation routine, i.e., the filter. In this way, the model is continuously adapted to the actual state of the battery, and the filter does not estimate incorrect values for the state variables. The separation of the estimation of state variables and parameters by the filter and the parameter estimator, respectively, may cause biased estimations to be avoided and/or to become improbable.

This method for state identification, which uses estimation of both the state variables and the model parameters they are based on, may not be sufficient to guarantee a required accuracy of the estimated values and to avoid divergences in covariance matrices, which are used for estimation.

Therefore, it is believed that the state and parameter estimation should be more stable, with computing and memory needs being reduced as much as possible, allowing such an estimation for all conceivable system states.

SUMMARY OF THE INVENTION

In an exemplary method according to the present invention, only specific state variables and/or parameters are used at a time for estimation, the selection being performed on the basis of the dynamic response of the measured performance quantities. An exemplary device according to the present invention includes an arrangement to determine the dynamic response of the measured performance quantities, for example, an arrangement to produce temporal gradients of the respective performance quantities, and a selection arrangement, which determines specific state variables and/or parameters from the corresponding estimation routine. Such a selection arrangement may, for example, be implemented in tables, as stepped functions, or as threshold value functions, through which specific parameters and/or state variables may be assigned to specific dynamic ranges of the performance quantities.

Kalman filters, which operate with covariance matrices of the estimated quantities, may be used for state estimation. Covariance matrices represent a root-mean-square deviation of the estimated value from the measured value on their diagonals, and the remaining matrix elements represent the correlations between the individual state variables. Through an exemplary method according to the present invention, the order of the matrices is reduced, and thus the numerical outlay and the necessary storage requirements may be diminished. Those parameters that change in different time ranges and in the event of different excitations, i.e., in the event of the performance quantities present, may also be determined better.

It is believed to be advantageous to estimate the state variables and/or parameters that have small time constants at a high dynamic response of the measured performance quantities, and to estimate the state variables having large time constants at a low dynamic response of the measured performance quantities. At the same time, the respective other state variables and/or parameters are maintained or tracked using a predetermined model.

In an example application of battery state identification, a battery model uses various resistance and voltage quantities having different time constants. Ohmic values and charge-transfer overvoltage have small time constants and may be estimated when the measured performance quantities have a large dynamic response. In contrast, the concentration overvoltage, for example, may have a large time constant, so that it may be estimated at a low dynamic response. The respective other quantities are maintained during the estimation or changed according to a predetermined pattern.

It is believed to be advantageous to determine, before the estimation determination, whether the system is in a limit state and if the state variables and/or parameters are only estimated if the system is not in a limit state. These types of limit states may exist, for example, at the beginning and the end of the service life of a technical system. In the exemplary application of battery state identification, more accurate estimated values may be dispensed with, if the battery is almost fully charged, since the limit state is a desirable and non-critical area. Another case exists if the battery is in a very poor (charge) state. Since a poor charge state is normally recognized sufficiently early, therefore, avoiding complete failure of the battery, this limit state may not be relevant.

Through the masking out of the estimation in the boundary areas of model accuracy, divergences of the filter/estimator and poor qualities of the quantities determined may be avoided. If, for example, the charge state of a fully charged battery worsens again, the battery automatically enters an operating point, in which the model used is valid, and a Kalman filter may provide estimated values of greater quality. It is believed that advantages may result in regard to necessary hardware. Lesser numerical complexity may thereby be achieved, and thus a lesser utilization of the processor and lesser demands for the storage requirements in the RAM.

In an exemplary method according to the present invention, the quality of the estimation determined on the basis of a covariance matrix described above may be checked. Specifically, the smaller the value in the covariance matrix for the respective state variable, the more probable or more accurate the estimated value of the quantity. The same applies for parameter estimation, in which there are covariance matrices in the typical estimation theories (e.g., Bayes, maximum likelihood methods), which make an assertion about the quality of the parameter estimation and/or the accuracy of the estimated parameter. The approach used is approximately the same as for the state estimator. The convergence (to values near zero) of the matrix quantities assigned to the estimated quantities may be used to rate the quality of the estimation. In addition, with appropriate weighting of the results determined, the overall assertion, in regard to the state variables, such as charge and aging state of the battery, may be enhanced.

Fixing a threshold value for the matrix value assigned to the respective estimated quantity may permit the quality of the estimation to be determined. These threshold values may be determined by experimental values and may be close to zero.

If the estimated values only have low quality, other "backup" methods may also be included in the evaluation, and may be more strongly weighted. Using a "backup" method, the respective quantities may be maintained or adjusted according to simple models that do not cause divergences. Alternatively, certain parameters may not, momentarily, be accepted from the state estimation routine or certain states may not, momentarily, initiate the parameter estimation routine.

DETAILED DESCRIPTION

An exemplary embodiment of the present invention may include state sensing for energy stores, such as automobile batteries, but is not limited to this application.

Figure 1A:
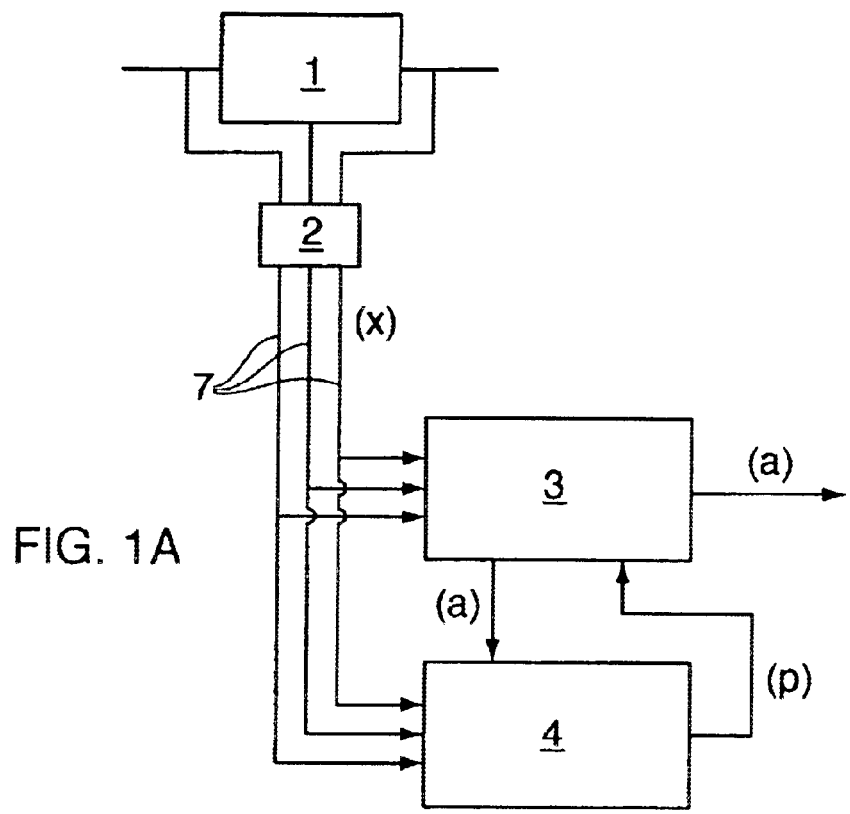
FIG. 1 is a schematic layout showing components of an exemplary device according to the present invention for state sensing of an energy store.

FIG. 1 shows the components for state sensing according to an exemplary embodiment of the present invention of an energy store 1, such as an automobile battery. A sensor and measurement unit 2 perform measurements of performance quantities x, such as current, voltage, and/or temperature, on battery 1. The measured performance quantities are supplied by lines 7 to a state estimator 3, which, for example, may determine state variables that characterize the current system state using a Kalman filter. Such state variables may include the available charge or the age of battery 1. State estimator 3 utilizes a model, in which measured performance quantities x are entered to determine the state variables a. The model operates using model parameters p, which are also dependent on the aging processes of energy store 1. To avoid the model losing its validity due to changed parameters p, model parameters p are updated using a parameter estimator 4. For this purpose, a parameter estimation routine is used, which uses measured performance quantities x and may also use additionally estimated state variables a as input quantities. Updated parameters p are then delivered to state estimator 3. For this purpose, state estimator 3 and parameter estimator 4 are connected to one another.

State variables a, determined by state estimator 3, are processed further to perform favorable measures (for example, charge state displays, modification of the energy supply).

Figure 1B:
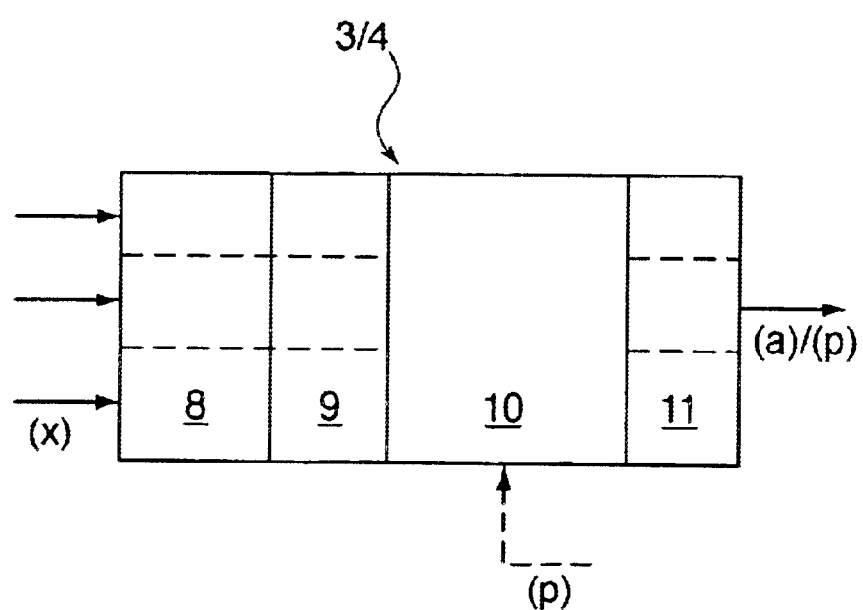

FIG. 1B shows a suitable state estimator 3 and parameter estimator 4, in which the individual components for state sensing, according to an exemplary embodiment of the present invention, are each present and assembled into one unit. Measured performance quantities x are supplied by lines 7 to state estimator 3 and/or parameter estimator 4. Subtractors or differentiators, which produce gradients of one measurement quantity x at a time, are used as a detection arrangement 8 for detecting the dynamic response of measured performance quantities x. A selection unit 9, which selects state variable a and/or parameters p subsequently estimated depending on the detected dynamic response of the performance quantities x, is connected downstream. Selected performance quantities x are supplied at state estimator 3, together with updated parameters p, to a computation unit 10, which computes specific state variables a using a model. Most estimation models operate with covariance matrices, the values assigned to the individual state variables of which converge toward zero, if the estimated value approximates the real value over time. These matrix values (covariances) may therefore be used for rating the quality of the estimation.

To rate the quality of the estimation, threshold values associated with the respective covariances may be, for example, fixed in a unit 11, and the quality of the estimation may be determined by subtracting the estimated value from the fixed threshold value. If, for example, an estimated state variable does not fall below the threshold value after a predetermined number of cycles, the estimated value may be rejected and the previously estimated value may be maintained instead. In this way, increasing deterioration of the estimation may be prevented.

Figure 2A:
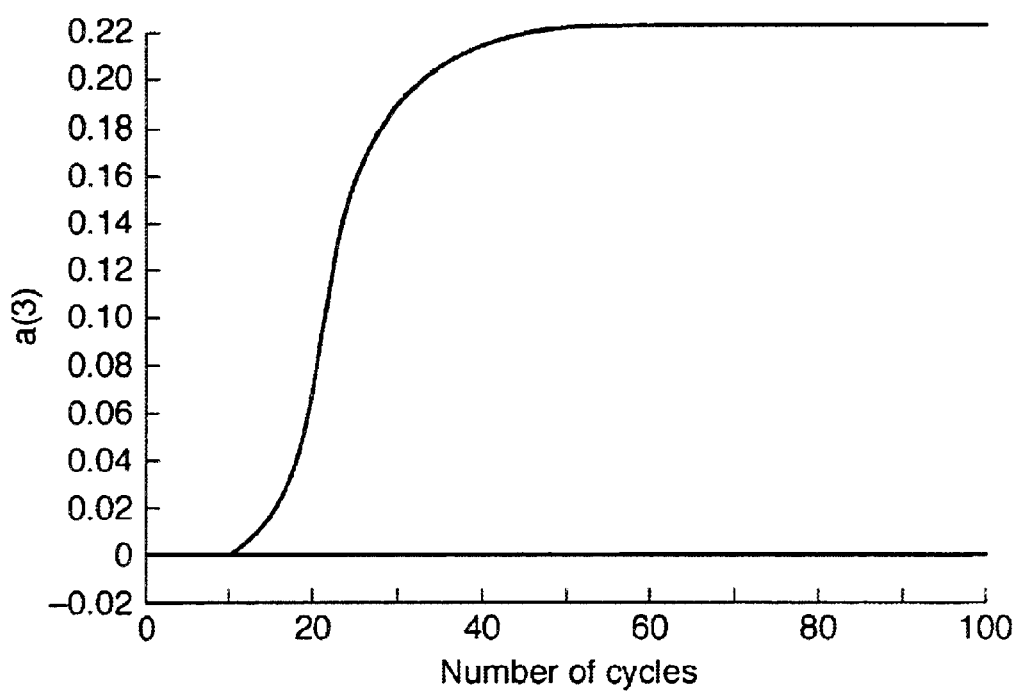
FIG. 2 shows an exemplary convergence of a state variable and an associated covariance.
Figure 2B:
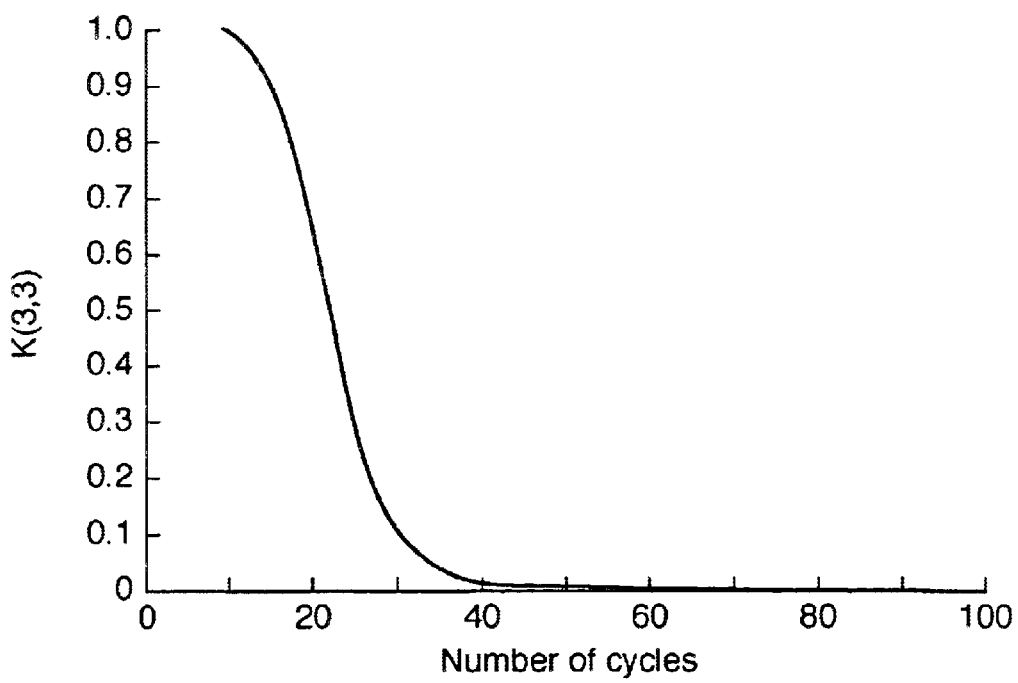

FIG. 2A shows an example of a rapidly converging estimated state variable a(3), which is not subject to any fluctuations after convergence. Such state variables, such as the concentration overvoltage, have large time constants. The associated matrix element of the covariance matrix shown in FIG. 2B, in this example K(3,3) to a(3), i.e., the covariance to this state variable, converges rapidly toward zero. To check the quality of the estimation, a threshold that may be reached after a certain number of cycles may be fixed, i.e., a number of iterative estimations. If not, the estimation for the state variable may be rejected.

Figure 3A:
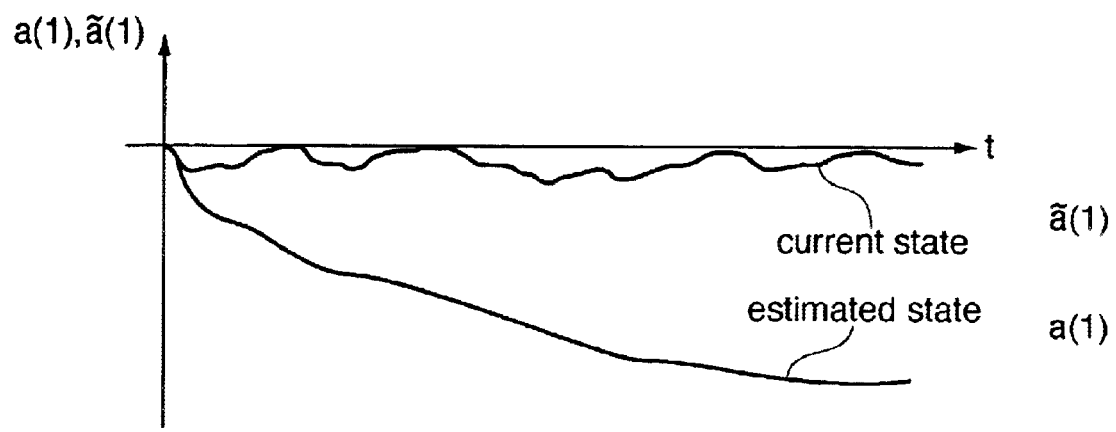
FIG. 3 shows an exemplary divergence of an estimated state variable and an associated covariance.

An example of a divergence of a current state variable ã(1) and associated estimated value a(1) is shown in FIG. 3. The fluctuating time curve of current state variable ã(1) and estimated state value a(1), which moves away from the zero line over time, is shown in FIG. 3A below the zero line.

Figure 3B:
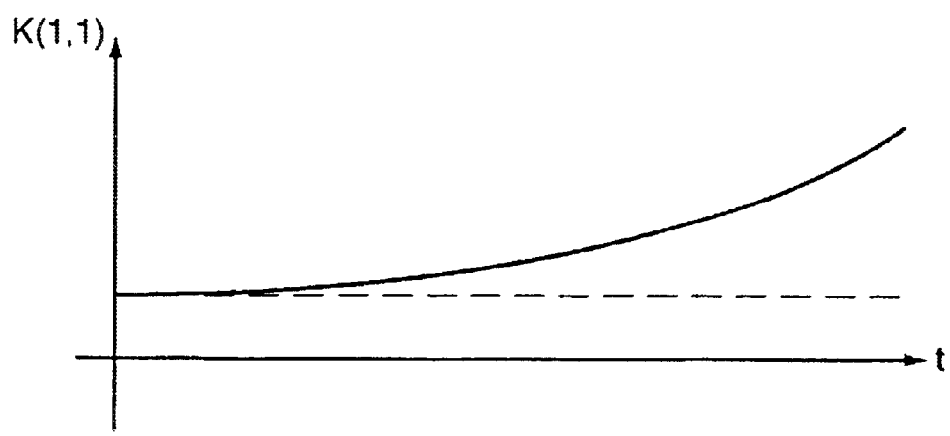

Associated covariance K(1,1) to state variable a(1) indicates that the estimation may not be suitable. The covariance does not converge, but increases continuously over time, as shown in FIG. 3B.

Cases, such as that of FIG. 3, may be avoided by an exemplary embodiment of the present invention, which utilizes "backup" methods, if the quality of the estimation is not sufficient.

Figure 4:
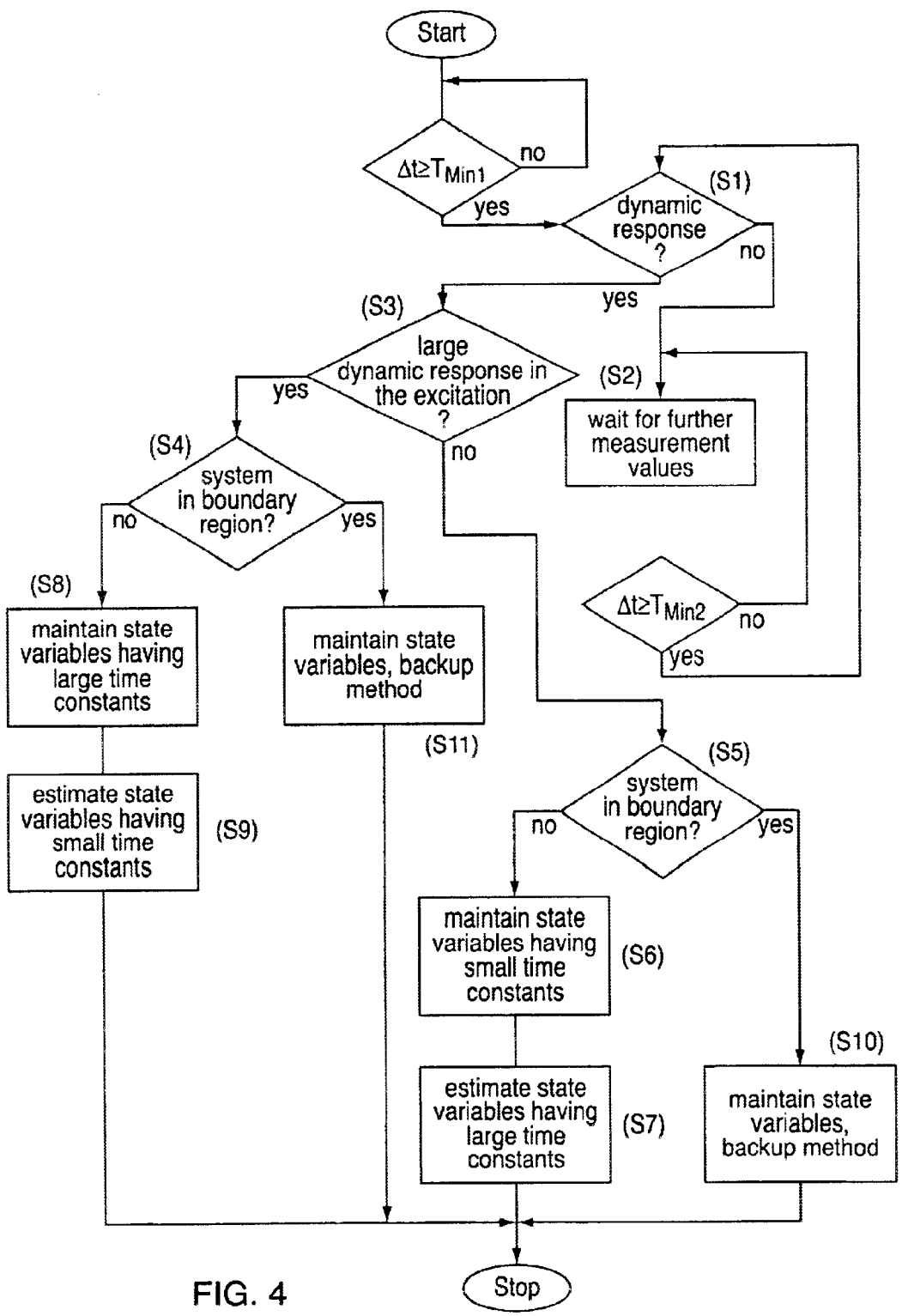
FIG. 4 is a flow diagram of an exemplary method according to the present invention.

FIG. 4 shows a flow diagram of an exemplary method according to the present invention. At the beginning of the estimation method, a specific time $T_{min1}$ passes, before the system assumes a state suitable for state estimation, which occurs before the actual estimation method begins. Subsequently, the dynamic response of the excitation, i.e., the dynamic response of measured performance quantities x, is scanned (S1). These may be, for example, time-dependent quantities current, temperature, and voltage. If, for example, the discharge current of the battery remains nearly zero over a relatively long period of time, since, for example, the consumer may be completely supplied by the generator, specific state variables a or parameters p dependent on the current may not be subject to change. Further measurement values are then awaited, until a further time interval $T_{min2}$ passes (S2).

If a dynamic response of the measured performance quantities begins, the quantity of the dynamic response is scanned (S3). For a low dynamic response of the measurement values, it is first determined whether the system is in a limit state or boundary region (in batteries, for example, the fully charged or drained state). The same scanning also occurs if there is a large dynamic response of the measured performance quantities (S4 and/or S5).

If the system is not in a boundary region, the actual estimation of the state variables may be started. According to an exemplary embodiment of the present invention, at a low dynamic response of the measurement values, state variables having small time constants are maintained (S6), while state variables having large time constants are estimated (S7). In contrast, for measurement values having a large dynamic response, the state variables having large time constants are maintained (S8), while the state variables having small time constants are estimated (S9). In the battery application described above, the ohmic values and the charge-transfer overvoltage represent state variables/parameters having small time constants, while, for example, the concentration overvoltage may represent a state variable having a large time constant. According to an exemplary embodiment of the present invention, the parameters and state variables that are not expected to cause changes in the dynamic response of the system are not redetermined by estimation. In this way, enlarging inaccuracies during the estimation due to unnecessarily frequent estimations, which may invalidate the model or provide incorrect state results, may be avoided.

If, while checking (S4, S5) whether the system is in a limit state (boundary region), it is determined that the system is in a limit state (boundary region), the state variables/parameters may be, for example, maintained or evaluated using "backup" methods (S10, S11), to avoid incorrect estimations (boundary regions of the model accuracy). These methods are based on stable models, in which no divergence is expected.

After the routine shown in FIG. 4 is finished, one cycle of the state estimation, according to an exemplary embodiment of the present invention, ends, and further cycles may follow immediately or with delays, which may be fixed.

Figure 5:
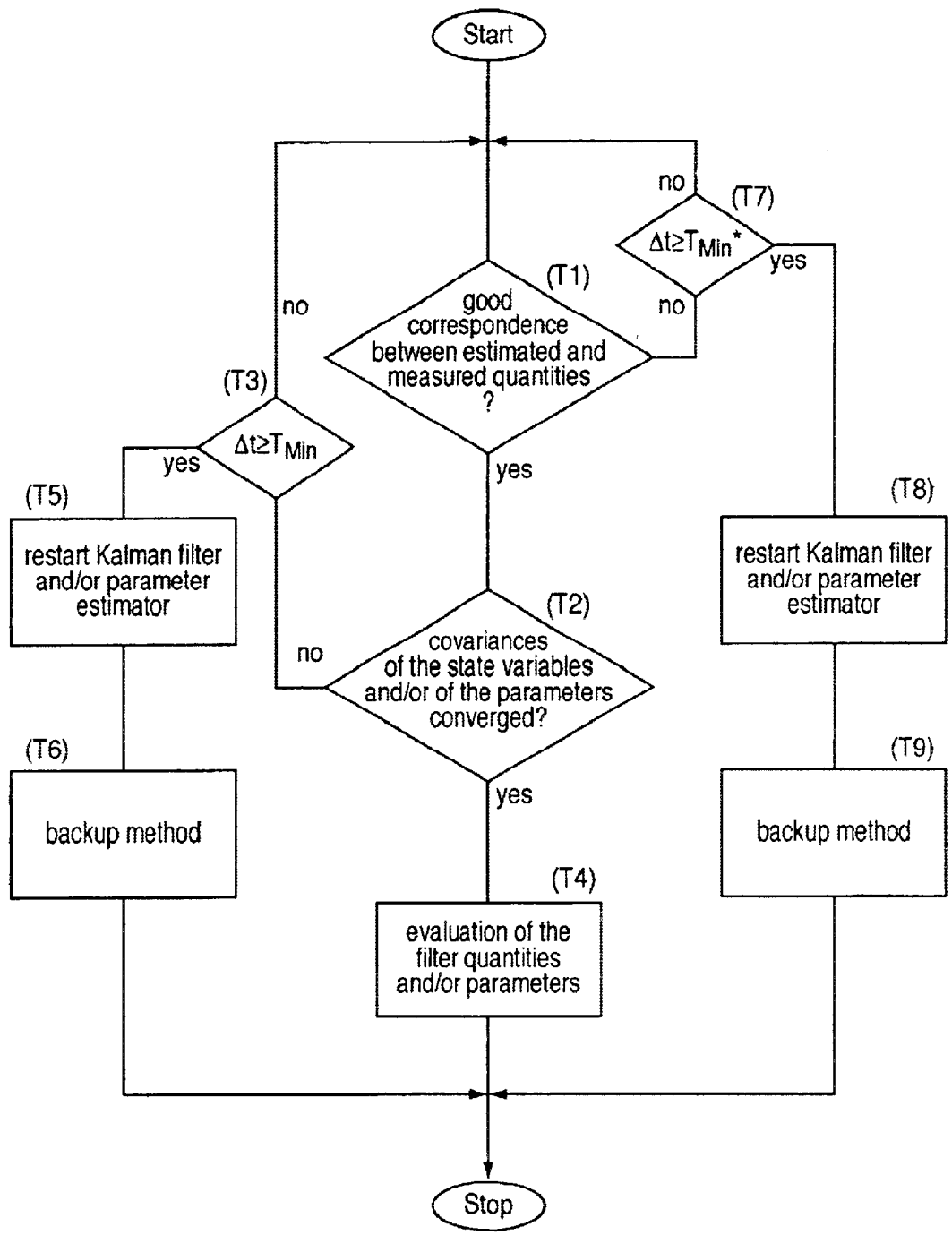
FIG. 5 is a flow diagram for determining the quality of estimated quantities.

FIG. 5 shows a flow diagram for determining the quality of the estimation described above. For this purpose, a measurable quantity, which is calculated from estimated quantities, is compared with the quantity actually measured (T1). If there is good correspondence (for example of the estimated and measured battery voltages), the convergence of the covariances associated with the state variables/parameters is checked (T2). Specifically, individual covariances may not yet have sufficiently converged (see also FIG. 2B), so that a specific typical convergence time $T_{min}$ still should be awaited (T3) until sufficiently good convergence results. When this occurs, the estimated state variables/parameters are evaluated (T4) and from this, for example, the charge state or the age of the battery may be determined.

In contrast, if time $T_{min}$ has already passed without the associated covariances having sufficiently converged, i.e., for example, having passed below a specific threshold value, the estimated quantities are rejected and the parameter estimation routine and/or the state estimation routine (Kalman filter) is restarted (T5). Until the reestimated quantities are received, simple "backup" methods may be utilized (T6).

If there is no sufficient correspondence between an easily measurable and estimable reference quantity (for example battery voltage) from the start, the covariance matrix may not be sufficiently converged. The result may be rechecked after a time period $T_{min}*$ (T7). If the result remains unchanged, the parameter and/or state estimation is restarted (see FIG. 4) and "backup" methods may be utilized (T8, T9).

What is claimed is:

1. A method for state sensing of a technical system, the technical system being an energy store, the method comprising:

measuring at least one performance quantity;

supplying the at least one measured performance quantity to a state estimation routine for determining at least one state variable characterizing a current system state using a model based on at least one system-dependent model parameter and the at least one measured performance quantity; and supplying the at least one measured performance quantity to a parameter estimation routine to determine the at least one system-dependent model parameter depending on a use to improve a state estimation;

wherein a selection of at least one of the at least one state variable characterizing the current system state and the at least one system-dependent model parameter determined by estimation depends on a dynamic response of the at least one measured performance quantity.

2. The method of claim 1, wherein at least one of the at least one state variable and ones of the at least one system-dependent model parameter not selected is one of unchanged and set again by fixed predetermined models.

3. The method of claim 1, wherein:

at a high dynamic response of the at least one measured performance quantity, ones of the at least one state variable having small time constants and ones of the at least one system-dependent model parameter having small time constants are selected for estimation; and at a low dynamic response, ones of the at least one state variable having large time constants and ones of the at least one system-dependent model parameter having large time constants are selected for estimation.

4. The method of claim 1, further comprising:

determining before an estimation determination whether the technical system is in a limit state at one of a beginning and an end of a service life of the technical system, wherein at least one of the at least one state variable state and the at least one system-dependent model parameter is not selected if the technical system is in the limit state.

5. The method of claim 1, wherein a quality of an estimation is checked based on a covariance matrix.

6. The method of claim 1, wherein at least one of the at least one state variable and the at least one system-dependent model parameter is used only if associated covariances of the covariance matrix converge.

7. A device for state sensing of a technical system, the technical system being an energy store, the device comprising:

a measuring arrangement to measure at least one performance quantity of the energy store;

a supplying arrangement to supply the at least one measured performance quantity to a state estimator to determine at least one state variable characterizing a current system state using a model based on at least one system-dependent model parameter and the at least one measured performance quantity;

a parameter estimator to determine the at least one system-dependent model parameter depending on a use to improve a state estimation, the at least one measured performance quantity being supplied to the parameter estimator;

a detecting arrangement to detect a dynamic response of the at least one measured performance quantity; and a selection unit connected to the detecting arrangement to select at least one of ones of the at least one state variable and ones of the at least one system-dependent model parameter determined in at least one of the state estimator and the parameter estimator depending on the dynamic response.

8. The device of claim 7, further comprising:

a calculating arrangement to calculate a covariance matrix for at least one of the at least one state variable and the at least one system-dependent model parameter; and an evaluating arrangement to evaluate the covariance matrix.

9. A computer program for being executed on at least one of a computer, a state estimator and a parameter estimator, the computer program comprising:

program code operable to perform a process for state sensing of a technical system, the technical system being an energy store, the process including:

measuring at least one performance quantity;

supplying the at least one measured performance quantity to a state estimation routine for determining at least one state variable characterizing a current system state using a model based on at least one system-dependent model parameter and the at least one measured performance quantity; and supplying the at least one measured performance quantity to a parameter estimation routine to determine the at least one system-dependent model parameter depending on a use to improve a state estimation;

wherein a selection of at least one of the at least one state variable characterizing the current system state and the at least one system-dependent model parameter determined by estimation depends on a dynamic response of the at least one measured performance quantity.

10. A computer program product for being executed on at least one of a computer, a state estimator and a parameter estimator, the computer program comprising:

a computer-readable data carrier storing program code that is operable to perform a process for state sensing of a technical system, the technical system being an energy store, the process including:

measuring at least one performance quantity;

supplying the at least one measured performance quantity to a state estimation routine for determining at least one state variable characterizing a current system state using a model based on at least one system-dependent model parameter and the at least one measured performance quantity; and supplying the at least one measured performance quantity to a parameter estimation routine to determine the at least one system-dependent model parameter depending on a use to improve a state estimation;

wherein a selection of at least one of the at least one state variable characterizing the current system state and the at least one system-dependent model parameter determined by estimation depends on a dynamic response of the at least one measured performance quantity.

11. The method of claim 1, wherein the at least one state variable is supplied to the parameter estimation routine.

12. The device of claim 7, wherein the at least one state variable is supplied to the parameter estimator.

* * * * *